(12) United States Patent
Marin et al.

(10) Patent No.: US 11,622,448 B2
(45) Date of Patent: Apr. 4, 2023

(54) SANDWICH-MOLDED CORES FOR HIGH-INDUCTANCE ARCHITECTURES

(71) Applicant: Intel Corporation, Santa Clara, CA (US)

(72) Inventors: Brandon C. Marin, Chandler, AZ (US); Tarek Ibrahim, Mesa, AZ (US); Srinivas Pietambaram, Chandler, AZ (US); Andrew J. Brown, Gilbert, AZ (US); Gang Duan, Chandler, AZ (US); Jeremy Ecton, Gilbert, AZ (US); Sheng C. Li, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 756 days.

(21) Appl. No.: 16/505,403

(22) Filed: Jul. 8, 2019

(65) Prior Publication Data
US 2021/0014972 A1    Jan. 14, 2021

(51) Int. Cl.
| H05K 1/11 | (2006.01) |
| H05K 1/16 | (2006.01) |
| H01L 23/00 | (2006.01) |
| H01F 27/40 | (2006.01) |
| H05K 3/40 | (2006.01) |
| H05K 3/28 | (2006.01) |

(52) U.S. Cl.
CPC .............. *H05K 1/165* (2013.01); *H01F 27/40* (2013.01); *H01L 24/16* (2013.01); *H05K 1/112* (2013.01); *H05K 3/28* (2013.01); *H05K 3/4007* (2013.01); *H05K 3/4038* (2013.01); *H01L 2224/16227* (2013.01); *H01L 2924/15311* (2013.01); *H01L 2924/18161* (2013.01); *H01L 2924/19042* (2013.01); *H01L 2924/19103* (2013.01)

(58) Field of Classification Search
CPC .......... H05K 1/112; H05K 1/165; H05K 3/28; H05K 3/4007; H05K 3/4038
USPC ....................................................... 174/262
See application file for complete search history.

(56) References Cited

U.S. PATENT DOCUMENTS

| 2009/0126983 A1* | 5/2009 | Harvey | ................. H05K 1/115 |
| | | | 174/266 |
| 2015/0092357 A1* | 4/2015 | Yoshikawa | ............ H05K 1/113 |
| | | | 216/13 |

(Continued)

*Primary Examiner* — Hoa C Nguyen
(74) *Attorney, Agent, or Firm* — Schwabe, Williamson & Wyatt, P.C.

(57) ABSTRACT

Embodiments include package substrates and method of forming the package substrates. A package substrate includes a first encapsulation layer over a substrate, and a second encapsulation layer below the substrate. The package substrate also includes a first interconnect and a second interconnect vertically in the first encapsulation layer, the second encapsulation layer, and the substrate. The first interconnect includes a first plated-through-hole (PTH) core, a first via, and a second via, and the second interconnect includes a second PTH core, a third via, and a fourth via. The package substrate further includes a magnetic portion that vertically surrounds the first interconnect. The first PTH core has a top surface directly coupled to the first via, and a bottom surface directly coupled to the second via. The second PTH core has a top surface directly coupled to the third via, and a bottom surface directly coupled to the fourth via.

25 Claims, 11 Drawing Sheets

(56) References Cited

U.S. PATENT DOCUMENTS

2019/0311916 A1* 10/2019 Chavali .............. H01L 23/5389
2020/0168536 A1* 5/2020 Link ................... H01L 21/4857

* cited by examiner

SANDWICH-MOLDED CORES FOR HIGH-INDUCTANCE ARCHITECTURES

FIELD

Embodiments relate to packaging electronic devices. More particularly, the embodiments relate to electronic devices with sandwich-molded cores for high-inductance architectures.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as with inductors, while optimizing the performance of each device, however is not without issue.

Inductors are critical components to substrate packaging and necessary to form a functional integrated voltage regulator for power delivery. Discrete inductors can be outsourced and embedded in a substrate or mounted on a surface of the substrate. These discrete inductors can be costly, the embedding process of such inductors can be complicated, and the surface mounting process of the discrete inductors can add an undesired thickness to the overall substrate.

Likewise, integrated air core inductors (ACIs) can overcome some of the disadvantages of the discrete inductors, however these ACIs are typically fabricated typically on the backside of a substrate in tandem with the rest of the substrate layers. Integrated ACIs, while less costly, do not provide as high of an inductance as provided by the discrete inductors. Also, the integrated ACIs can take up valuable real estate in a substrate in order to meet the desired inductance. Accordingly, as stated above, the scaling of ICs features has led to shrinking cores and increasing the number of cores, which ultimately requires less ACI area and results in lesser efficiency.

Recently, existing technologies are actively pursuing several options to replace ACIs such as coaxial magnetic induction layers (MILs). Magnetic materials used to create these coaxial MILs generally includes magnetic filler embedded epoxy pastes that can be squeeze printed into plated-through-holes (PTHs) in the cores of the substrates. The pitches of the PTHs are typically limited due to flatness and thickness limitations of the traditional pre-preg based cores. This limits the number of MILs created in the substrate, which in turn places a limit on the power efficiency achieved with this architecture. Additionally, increasing core thicknesses of MILs further add additional complicated limitations. For example, implementing PTHs with increased thicknesses has been extremely challenging with existing technologies due to mass-transfer limitations with plating chemistries and diminishing drill bit life expectancies.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
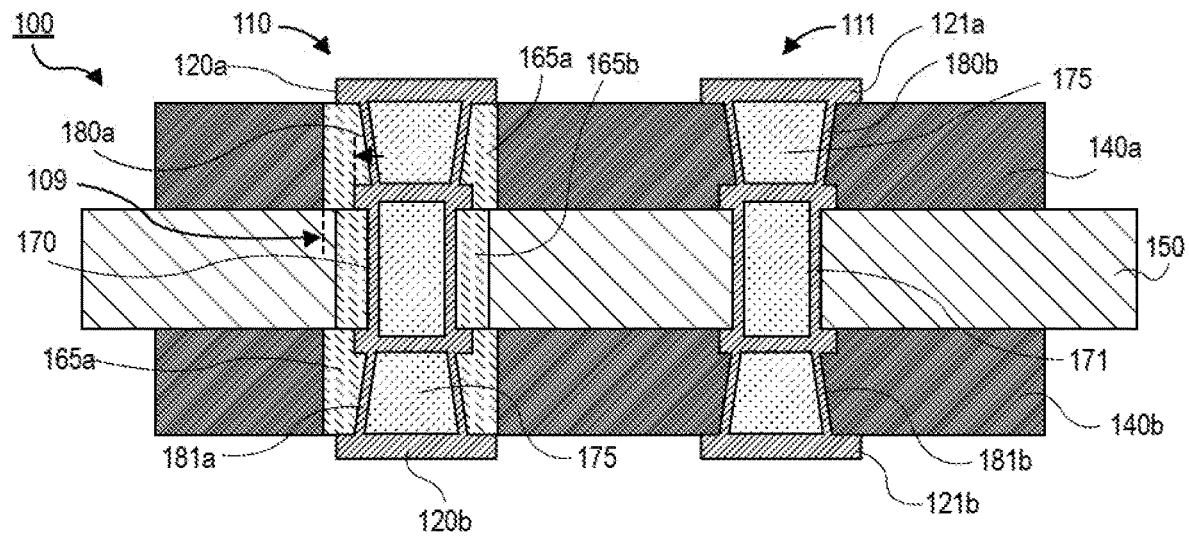
FIG. 1A is an illustration of a cross-sectional view of a package substrate with a plurality of plated-through-holes (PTH) vias, a core substrate, and a plurality of encapsulation layers, where the PTH vias are embedded in the core substrate and the encapsulation layers, according to one embodiment.

Described herein are package substrates with sandwich-molded coaxial magnetic induction layers (MILs) and methods of forming such package substrates. The package substrates described below and methods of forming such package substrates may include a plurality of plated-through-hole (PTH) vias (e.g., the coaxial MIL structures), a core substrate, and a plurality of encapsulation layers, according to some embodiments. The embodiments described herein may comprise of coaxial MIL structures that are embedded in the core substrate and the encapsulation layers, according to one embodiment.

In these embodiments, the package substrates include segmenting the plating and the drilling processes that are used to implement the PTH vias (i.e., the plated-through-holes (PTHs)). The segmenting of these package substrates also includes adding thick amounts of encapsulation layers (e.g., mold layers, other epoxy-based build-up layers, etc.) after implementing (or disposing/forming) the initial PTH vias. Accordingly, this increases the overall thickness of the PTH vias of the package substrate, thereby substantially increasing/improving the overall inductance of such package substrate.

The embodiments described herein provide improvements to existing packaging solutions by segmenting the plating and drilling steps implemented for the package substrates, and thereby circumventing any of the limitations typically involved with drilling and plating substantially thicker cores (or inductor cores). For example, as described in further detail below, such embodiments enable increasing the core thicknesses (or the coaxial structure thicknesses) by two or more (i.e., doubling the core thicknesses), where such doubled increases of the core thicknesses yield double the overall inductance (i.e. two-times (2×) or more) the inductance). The package substrates also improve the overall efficiency of the coaxial MILs described herein (e.g., improving the fully integrated voltage regulator (FIVR) efficiency), which may surpass the efficiency of similar inductors such as air core inductors (ACIs). For example, the overall FIVR efficiency (or the power delivery) is substantially improved by enhancing the electrical functionality of such package substrates with thick embedded magnetic inductors. This further enhances (or improves) such electrical functionality by extending the embodiments described herein to the emerging and increasingly adopted fields of molded interconnect substrate (MIS) packaging technologies.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with package substrates that have coaxial MTh structures, core substrates, and encapsulation layers.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1B:
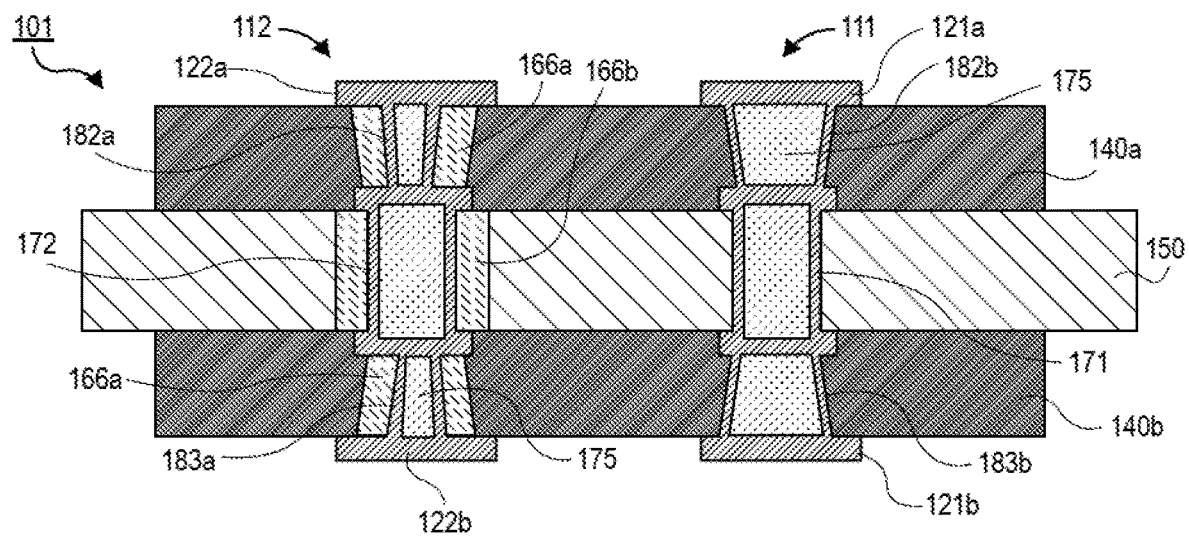
FIG. 1B is an illustration of a cross-sectional view of a package substrate with a plurality of PTH vias, a core substrate, and a plurality of encapsulation layers, where the PTH vias are embedded in the core substrate and the encapsulation layers, according to one embodiment.

FIGS. 1A-1B are cross-sectional illustrations of package substrates 100-101 with a plurality of PTH vias 110-112, a core substrate 150, and a plurality of encapsulation layers 140a-b, according to one embodiment. As shown in FIGS. 1A-1B, the package substrates 100-101 may include the respective PTH vias 110-112 that are embedded in the core substrate 150 and the encapsulation layers 140a-b, according to an embodiment. In one embodiment, these package substrates 100-101 may include the presence of the encapsulation layers 140a-b (e.g., mold layers) that may be clearly distinguished from the surrounding core material (e.g., glass fibers) of the core substrate 150. Additionally, in some embodiments, the package substrates 100-101 may be implemented with one or more different resulting architectures, for example, the package substrate 100 may be implemented with photoimageable encapsulation layers that provide magnetic filler portions with substantially vertical/straight sidewalls, while the package substrate 101 may be implemented with general encapsulation layers that provide magnetic filler portions with tapered sidewalls.

Referring now to FIG. 1A, a cross-sectional illustration of a package substrate 100 is shown, in accordance with an embodiment. In an embodiment, the package substrate 100 may include a plurality of PTH vias 110-111, a core substrate 150, and a plurality of encapsulation layers 140a-b, according to some embodiments. In some embodiments, the PTH vias 110-111 may be embedded (or sandwiched/surrounded) within the encapsulation layers 140a-b and the core substrate 150 (or the substrate). The PTH vias 110-111 may include a plurality of cores 170-171 (or a plurality of magnetic cores) that are respectively stacked with a plurality of first vias 180a-b and a plurality of second vias 181a-b. In one embodiment, the cores 170-171 may be implemented as a first core 170 and a second core 171. In one embodiment, the first and second cores 170-171 may be disposed in the core substrate 150, where the first vias 180a-b are stacked above the respective first and second cores 170-171, and the second vias 181a-b are stacked below the respective first and second cores 170-171.

Additionally, as shown in FIG. 1A, the PTH vias 110-111 may be implemented as a first PTH via 110 and a second PTH via 111. In one embodiment, the first PTH via 110 may be a magnetic PTH via, while the second PTH via 111 may be a non-magnetic PTH via. For example, the first PTH via 110 may be embedded/surrounded in a magnetic portions 165a-b (or magnetic layers).

For some embodiments, a plurality of first conductive pads 120a-120b may be disposed on the first PTH via 110, where the first conductive pad 120a may be positioned over the first PTH via 110 and opposite to the first conductive pad 120b under/below the first PTH via 110. Likewise, a plurality of second conductive pads 121a-121b may be disposed on the second PTH via 111, where the second conductive pad 121a may be positioned over the second PTH via 111 and opposite to the second conductive pad 121b under/below the second PTH via 111. In one embodiment, the first and second PTH vias 110-111 may be filled (or disposed) with a resin 175, where the resin 175 may be disposed within (or between) the cores 170-171, the vias 180a-b and 181a-b, and the first and second conductive pads 120a-b and 121a-b.

For one embodiment, the package substrate 100 may include, but is not limited to, a package, a substrate, a printed circuit board (PCB), and a motherboard. For one embodiment, the package substrate 100 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more mold layers (e.g., the encapsulation layers 140a-b) and/or one or more dielectric layers, where each dielectric layer may be a photosensitive dielectric layer. For one embodiment, the PCB 100 may include a plurality of conductive layers (e.g., the PTH vias 110-111, the conductive pads 120a-b and 121a-b, etc.), which may further include copper (or metallic) traces, lines, pads, vias, via pads, holes, and/or planes.

In one embodiment, the package substrate 100 may dispose (or sandwich) the core substrate 150 between the encapsulation layers 140a-b, where such encapsulation layers 140a-b may be a first encapsulation layer 140a and a second encapsulation layer 140b. For one embodiment, the first encapsulation layer 140a may be disposed over the core substrate 150, while the second encapsulation layer 140b may be disposed below (or under) the core substrate 150. For one embodiment, the core substrate 150 may be a magnetic core substrate, a magnetic coreless substrate, and/or the like.

In some embodiments, the core substrate 150 may have a thickness of approximately 100 um to 1000 um. In another embodiment, the core substrate 150 may have a thickness of approximately 100 um or less. For one embodiment, the core substrate 150 may include one or more materials such as epoxy, glass (or glass fibers), and/or the like. For example, the core substrate 150 may be a glass fiber reinforced core substrate.

In one embodiment, the encapsulation layers 140a-b may be a mold layer and/or any similar encapsulation/molding material(s). In particular, according to some embodiments, the encapsulation layers 140a-b may be a photoimageable mold layer. For one embodiment, the encapsulation layers 140a-b may include an epoxy (e.g., a soft epoxy, a stiff epoxy, opaque epoxy, etc.) with one or more filler materials (e.g., glass fillers). For example, the encapsulation layers 140a-b may include an acrylate (e.g., a negative resist material), a diazobenzoquinone (e.g., a positive permanent resist material), an epoxy, a polyimide, and/or the like. In some embodiments, the encapsulation layers 140a-b may include the same (or substantially the same) mold materials, while, in other embodiments, the encapsulation layers 140a-b may include different mold materials.

As shown in FIG. 1A, the encapsulation layers 140a-b are disposed over the core substrate 150, the respective first and second vias 180a-b and 181a-b, and the first and second cores 170-171. In these embodiments, the encapsulation layers 140a-b may have a thickness desired to embed (or surround/sandwich) the respective first and second vias 180a-b and 181a-b that are disposed over/under the core substrate 150. In some embodiments, the thickness of the encapsulation layers 140a-b may be approximately 100 um to 1000 um. In another embodiment, the thickness of the encapsulation layers 140a-b may be approximately 100 um or less. In an embodiment, the encapsulation layers 140a-b may be compression molded, laminated, planarized, or the like. For example, the encapsulation layers 140a-b may have top surfaces that are substantially coplanar to the respective top surfaces of the first and second vias 180a-b and 181a-b, where the respective conductive pads 120a-b and 121a-b may be disposed over portion(s) of the respective top surfaces of the encapsulation layers 140a-b and the first and second vias 180a-b and 181a-b.

For some embodiments, the thickness of the encapsulation layers 140a-b may be disposed over the core substrate 150 and the PTH vias 110-111 to implement sandwich-molded magnetic coaxial core structures (or sandwich-molded MILs) with substantially higher thicknesses for increased/heightened inductances. For example, the thicknesses of the encapsulation layers 140a-b may be increased to an overall thickness of the sandwich-molded magnetic coaxial core structures, which respectively increases an overall inductance substantially (i.e., a 2× increase in overall thickness may be equivalent to 2× or more increase in the overall inductance). Such embodiments of the encapsulation layers 140a-b and the PTH vias 110-111 may be implemented with a lithographic process, a sacrificial polymer process, and/or the like to form these sandwich-molded magnetic coaxial core structures, which may also implement (or pattern/form) the magnetic portions 165a-b to have substantially vertical sidewalls (i.e., the portions of the encapsulation layers 140a-b surrounding the PTH via 110 may thus also have substantially vertical sidewalls).

In some embodiments, the PTH vias 110-111, including the cores 170-171, the first and second vias 180a-b and 181a-b, and the first and second conductive pads 120a-b and 121a-b, may be comprised of a conductive material such as a metal (e.g., copper) and/or the like. In one embodiment, the PTH vias 110-111 may be implemented by a laser/drilling process (i.e., a laser through hole (LTH) process), an electroless deposition process, and/or the like to pattern/form the via openings, vias, conductive pads, conductive sidewalls, and so on. For one embodiment, the PTH vias 110-111 may be laser-plated vias formed with any convention process, including, for example, an electroless Cu plating process or the like.

In some embodiments, the first and second vias 180a-b and 181a-b may have a thickness of approximately 100 um to 1000 um. In another embodiment, the first and second vias 180a-b and 181a-b may have a thickness of approximately 100 um or less. Additionally, in some embodiments, the first and second conductive pads 120a-b and 121a-b may have a thickness of approximately 5 um to 50 um. In another embodiment, the first and second conductive pads 120a-b and 121a-b may have a thickness of approximately 5 um or less. For some embodiments, the first and second conductive pads 120a-b and 121a-b may have a width of approximately 75 um to 400 um. In another embodiment, the first and second conductive pads 120a-b and 121a-b may have a width of approximately 75 um or less.

Moreover, in some embodiments, the first and second cores 170-171 may have a width of approximately 75 um to 200 um (i.e., a width from one sidewall to an opposite sidewall within the core substrate 150). In another embodiment, the first and second cores 170-171 may have a width of approximately 75 um or less. Also, in some embodiments, the first PTH via 110 may have a width that is substantially equal to a width of the second PTH via 111 (i.e., the first vias 120a-b and the first core 170 may have the same width as the second vias 121a-b and the second core 171). In alternate embodiments, the first PTH via 110 may have a width that is different from a width of the second PTH via 111 (i.e., the first vias 120a-b and the first core 170 may have different widths than the second vias 121a-b and the second core 171).

In some embodiments, the package substrate 100 may have a pitch from the center of the first core 170 of the first PTH via 110 to the center of the second core 171 of the second PTH via 111 that may be approximately 300 um to 1000 um. In another embodiment, the package substrate 100 may have a pitch from the center of the first core 170 of the first PTH via 110 to the center of the second core 171 of the second PTH via 111 that may be approximately 300 um or less.

As described above, the PTH vias 110-111 may be filled with the resin 175. The resin 175 may be disposed within (or embedded in between/surrounded with) the sidewalls of the first and second cores 170-171 and the first and second vias 180a-b and 181a-b of the respective PTH vias 110-111. In one embodiment, the resin 175 may include one or more filler materials such as epoxy, glass (or glass fibers), or the like, and/or any combination thereof. Additionally, as described above, the first PTH via 110 may be a magnetic PTH via that is surrounded (or embedded) with the magnetic portions 165a-b. In one embodiment, the magnetic portions 165a-b may include one or more magnetic materials such as ferrite, epoxy, or the like, and/or any combination thereof.

The first magnetic portion 165a may surround the first and second vias 180a and 181a, and where the second magnetic portion 165b may surround the first core 170. Note that the first and second magnetic portions 165a-b may include the same materials. Furthermore, as shown in FIG. 1A, the first magnetic portion 165a may have a width that is greater than a width of the second magnetic portion 165b. In one embodiment, the second magnetic portion 165b may have a width that is defined from the sidewall of the first core 170 to the adjacent wall (or edge) of the core substrate 150, where such width of the second magnetic portion 165b may be approximately 10 um to 500 um. Accordingly, in some embodiments, an offset portion 109 may be formed between the widths of the first magnetic portions 165a and the width of the second magnetic portion 165b. That is, the offset portion 109 may have a width that is substantially equal to the difference between the widths of the first magnetic portions 165a and the width of the second magnetic portion 165b. For example, in one embodiment, the width of the offset portion 109 may be approximately 2 um to 40 um. In another embodiment, the width of the offset portion 109 may be approximately 2 um or less.

Referring now to FIG. 1B, a cross-sectional illustration of a package substrate 101 is shown, in accordance with an embodiment. The package substrate 101 may be substantially similar to the package substrate 100 described above in FIG. 1A, with the exception that the PTH via 112 is a magnetic PTH via surrounded with the first magnetic portions 166a, and that the first magnetic portions 166a have tapered sidewalls. Whereas the first magnetic portions 165a of FIG. 1A have substantially vertical sidewalls, and the widths of the first magnet portions 165a of FIG. 1A are greater than the width of the second portion 165b of FIG. 1A, the second magnetic portion 165b of FIG. 1A, the first magnetic portions 166a of FIG. 1B have tapered sidewalls, such as angled between approximately 40 degrees to 85 degrees, and the widths of the first magnet portions 166a of FIG. 1B are less than the width of the second portion 166b of FIG. 1B.

The first PTH via 112 may be substantially similar to the first PTH via 110 described above in FIG. 1A, with the exception that the first magnetic portions 166a have tapered sidewalls rather than substantially vertical sidewalls of the first magnetic portions 165a of FIG. 1A. Additionally, as described above, the PTH vias 111-112, the encapsulation layers 140a-b, the core substrate 150, the resin 175, the conductive portions 166a-b, the cores 171-172, the vias 182a-b and 183a-b, and the conductive pads 121a-b and 122a-b of the package substrate 101 may be substantially similar to the PTH vias 110-111, the encapsulation layers 140a-b, the core substrate 150, the resin 175, the conductive portions 165a-b, the cores 170-171, the vias 180a-b and 181a-b, and the conductive pads 120a-b and 121a-b of the package substrate 100 described above in FIG. 1A.

In some embodiments, unlike the encapsulation layers 140a-b of FIG. 1A, the encapsulation layers 140a-b of FIG. 1B may include one or more mold materials such as epoxy, polymide, polynorbornene, polyimidazole, polyurethane, polyethylene teraphthelate, poly-cylco-olefin, polysiloxane, silicon oxide ($SiO_2$) glass filler, titania ($TiO_2$) filler, or the like, and/or any combination thereof. Furthermore, in one embodiment, the first and second vias 182a and 183a of the first PTH via 112 may have a width that is less than a width of the first and second vias 182b and 183b of the second PTH via 111. Additionally, in some embodiments, the first core 172 may have a width that is greater than a width of the first and second vias 182a and 183a.

Note that the package substrates 100-101 of FIGS. 1A-1B may include fewer or additional packaging components based on the desired packaging design.

FIGS. 2A-2H are illustrations of cross-sectional views of a process flow to form a package substrate 200 with a first PTH via 210 and a second PTH via 211, according to some embodiments. The process flow illustrated in FIGS. 2A-2H forms the package substrate 200 that is substantially similar to the package substrate 100 described above in FIG. 1A. Likewise, the components of the package substrate 200 are substantially similar to the components of the package substrate 100 described above in FIG. 1A. Accordingly, as described above, the process flow of the package substrate 200 illustrates one of the approaches to implement sandwich-molded magnetic coaxial core structures (or sandwich-molded MILs) with substantially higher thicknesses for increased/heightened inductances. In some embodiments, as described below, the process of the package substrate 200 may be implemented with a photoimageable encapsulation process (or the like), a lithographic process, a sacrificial polymer process (or sacrificial polymer techniques), and/or any combination thereof to form such magnetic coaxial core structures, which may also implement first and second magnetic portions 265a-b with substantially vertical sidewalls.

Figure 2A:
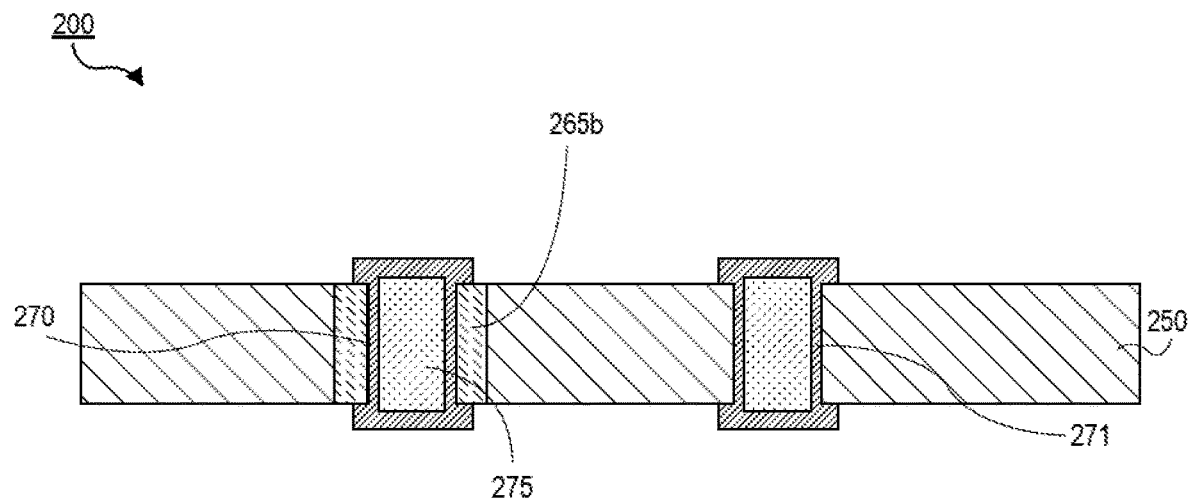
FIGS. 2A-2H are illustrations of cross-sectional views of a process flow to form a package substrate with a plurality of PTH vias, a core substrate, and a plurality of encapsulation layers, where the PTH vias are embedded in the core substrate and the encapsulation layers, according to some embodiments.

Referring now to FIG. 2A, a cross-sectional illustration of a package substrate 200 is shown, in accordance with an embodiment. In an embodiment, the package substrate 200 may include a core substrate 250. The core substrate 250 may include a first core 270 and a second core 271, where the first and second cores 270-271 may be filled with a resin 275. In one embodiment, the first core 270 may be surrounded with a second magnetic portion 265b, where the second magnetic portion 265b may isolate the first core 270. For one embodiment, the second magnetic portion 265b may have a width (or a total width) that is greater than a width of the first core 270.

Figure 2B:
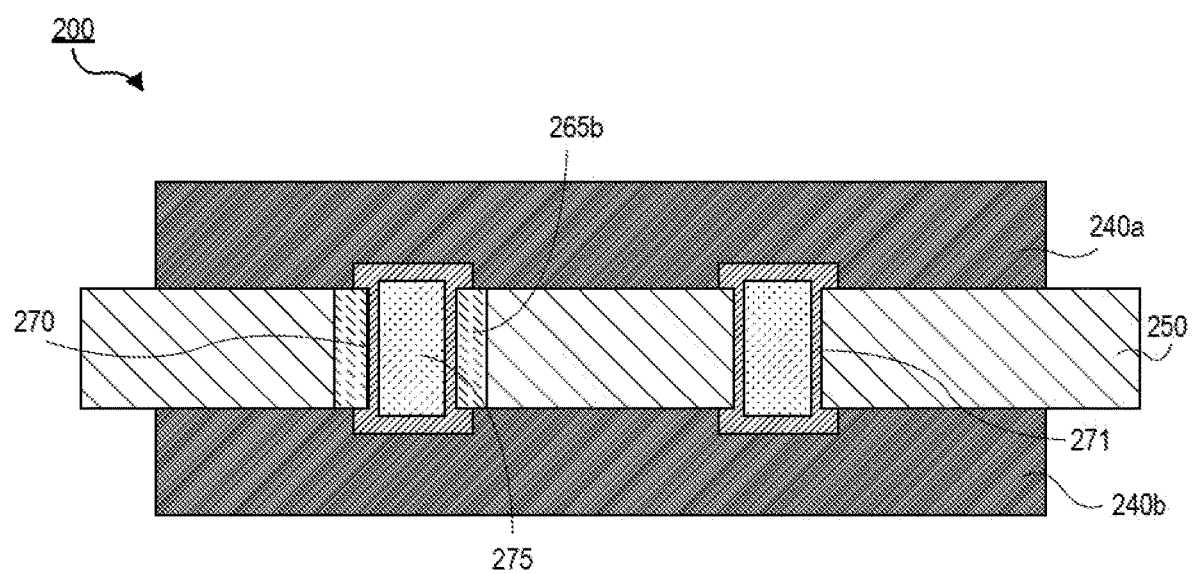

Referring now to FIG. 2B, a cross-sectional illustration of a package substrate 200 is shown, in accordance with an embodiment. In an embodiment, a plurality of first and second encapsulation layers 240a-b are disposed over the second magnetic portion 265b and the first and second cores 270-271 of the core substrate 250. In one embodiment, the first and second encapsulation layers 240a-b may be implemented (overmolded) with a molding process (or a two-sided mold application process) or the like. Additionally, in another embodiment, the first and second encapsulation layers 240a-b may be planarized with a polishing/grinding process or the like. The first and second encapsulation layers 240a-b may be substantially similar to the first and second encapsulation layers 140a-b described above in FIG. 1A (i.e., the first and second encapsulation layers 240a-b may be a photoimageable mold layers).

Figure 2C:
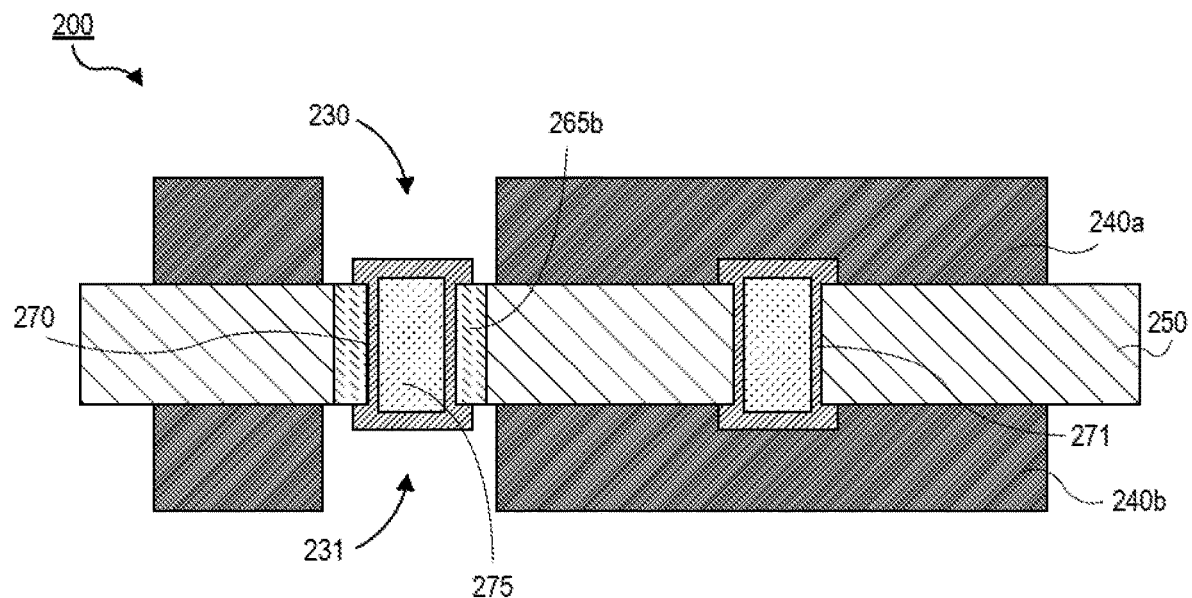

Referring now to FIG. 2C, a cross-sectional illustration of a package substrate 200 is shown, in accordance with an embodiment. In an embodiment, openings 230-231 may be symmetrically patterned (or developed/removed) into the respective encapsulation layers 240a-b using a developer, a sacrificial polymer, or the like. In one embodiment, the opening 230 may be patterned over the first core 270, while the opening 231 may be respectively patterned below the first core 270. Furthermore, as described above, the openings 230-231 of the first and second encapsulation layers 240a-b may have substantially vertical sidewalls. The openings 230-231 may have the same widths, and the widths of these openings 230-231 may be greater than the widths of both the first core 270 and the second magnetic portion 265b.

Figure 2D:
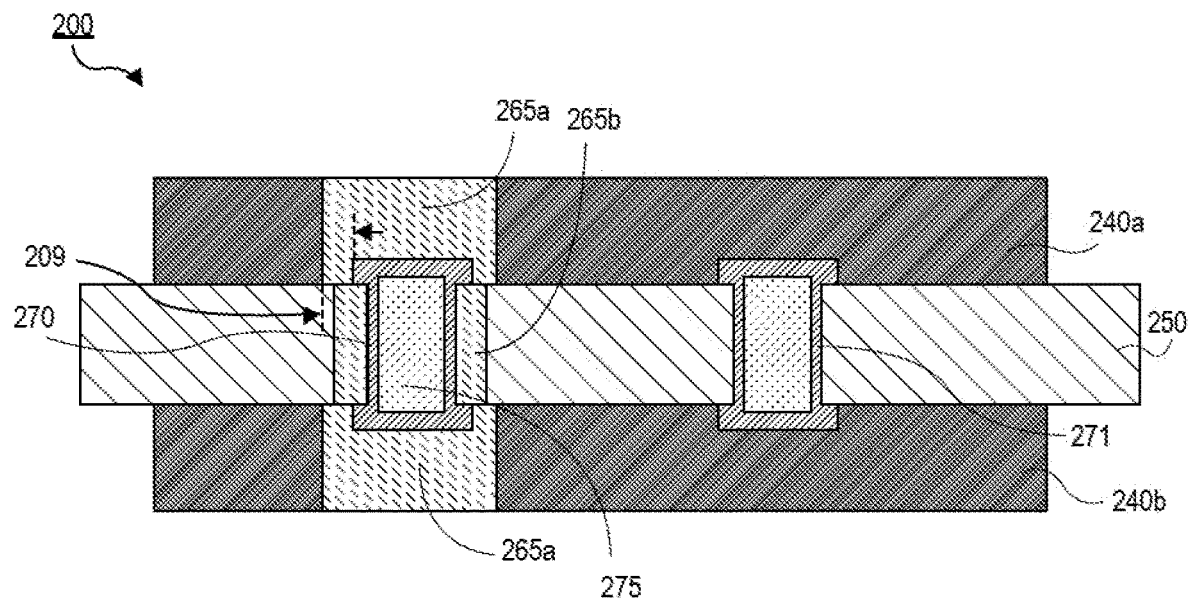

Referring now to FIG. 2D, a cross-sectional illustration of a package substrate 200 is shown, in accordance with an embodiment. In an embodiment, first magnetic portions 265a may be symmetrically disposed (or plugged) into the respective openings 230-231. Furthermore, as described above, the first magnetic portions 265a may have substantially vertical sidewalls. The first magnetic portions 265a may be implemented with any known packaging processes. The first magnetic portions 265a may be substantially similar to the second magnetic portion 265b. In one embodiment, the first magnetic portions 265a may be planarized to have top surfaces that are substantially coplanar to the top surfaces of the respective encapsulation layers 240a-b.

Additionally, after disposing/plugging the first magnetic portions 265a, an offset portion 209 may be formed between the widths of the first magnetic portion 265a and the width of the second magnetic portion 265b. That is, the offset portion 209 may have a width that is substantially equal to the difference between the widths of the first magnetic portions 265a and the width of the second magnetic portion 165b. For example, in one embodiment, the width of the offset portion 209 may be approximately 2 um to 40 um. In another embodiment, the width of the offset portion 209 may be approximately 2 um or less.

Figure 2E:
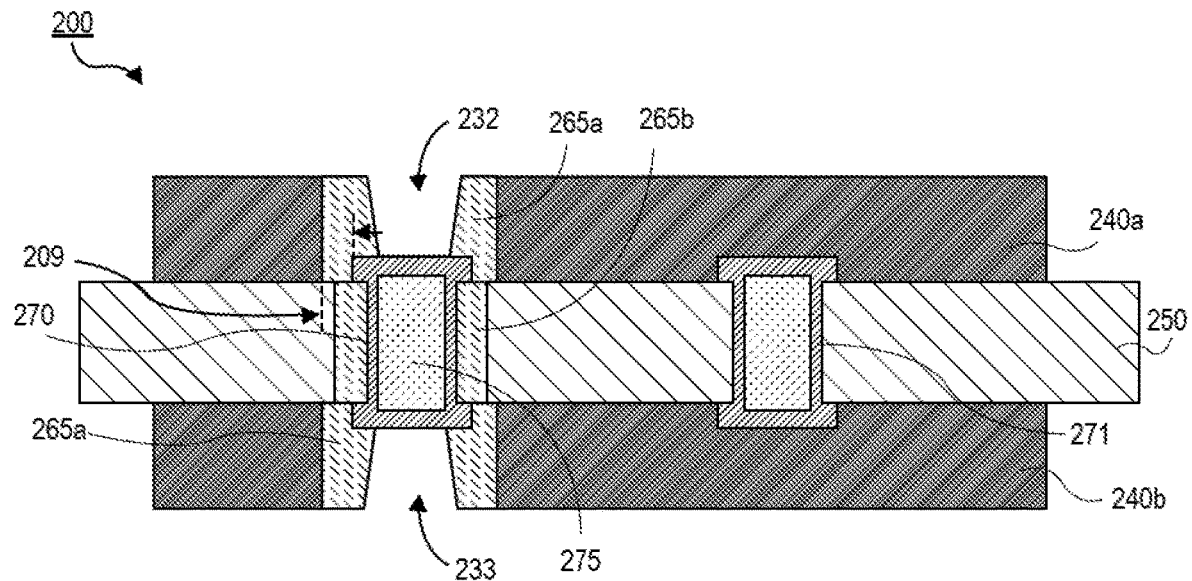

Referring now to FIG. 2E, a cross-sectional illustration of a package substrate 200 is shown, in accordance with an embodiment. In an embodiment, openings 232-233 may be patterned (or drilled) into the respective first magnetic portions 265a using a LTH drilling process (or the like) with a high-pressure water clean and so on. In one embodiment, the opening 232 may be patterned into the top first magnetic portion 265a to expose a surface of the top conductive pad of the first core 270. In an embodiment, the opening 233 may be patterned into the first magnetic portion 265a to expose a surface of the bottom conductive pad of the first core 270.

Figure 2F:
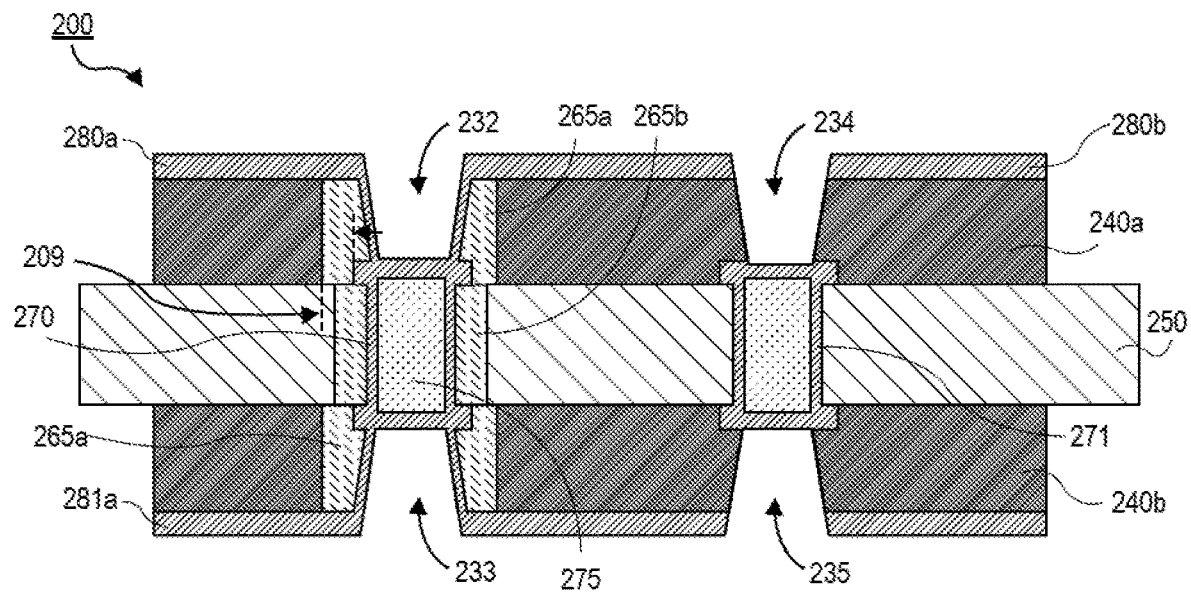

Referring now to FIG. 2F, a cross-sectional illustration of a package substrate 200 is shown, in accordance with an embodiment. In an embodiment, a conductive material (e.g., copper or the like) may be disposed over the first encapsulation layer 240a and into the opening 232 to implement a first via 280a, where the first via 280a is disposed into/onto the exposed walls of the respective first magnetic portion 265a. Likewise, in one embodiment, the conductive material may also be disposed over the second encapsulation layer 240b and into the opening 233 to implement a second via 281a, where the second via 281a is disposed into/onto the exposed walls of the respective first magnetic portion 265a.

Additionally, in some embodiments, openings 234-235 may be patterned (or drilled) into the respective first and second encapsulation layers 240a-b using a LTH drilling process (or the like), a desmear process, and so on. In one embodiment, the opening 234 may be patterned into the first encapsulation layer 240a to expose a surface of the top conductive pad of the second core 271. In an embodiment, the opening 235 may be patterned into the second encapsulation layer 240b to expose a surface of the bottom conductive pad of the second core 271.

Figure 2G:
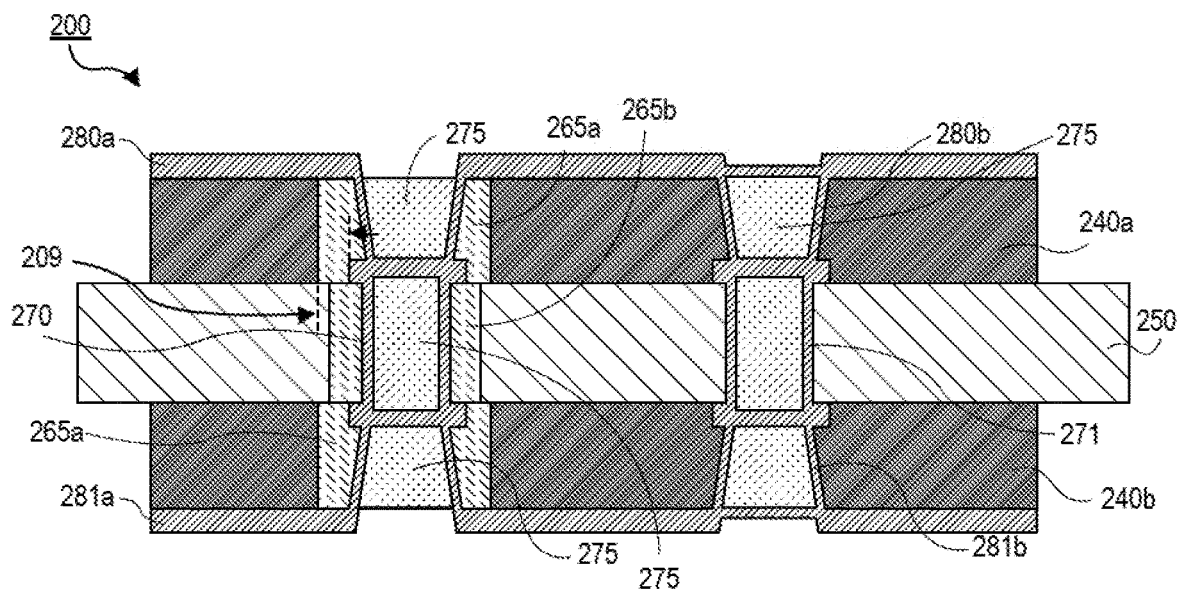

Referring now to FIG. 2G, a cross-sectional illustration of a package substrate 200 is shown, in accordance with an embodiment. In an embodiment, the resin 275 may be disposed over the respective first and second vias 280a and 281a. Additionally, a first via 280b and a second via 281b may be disposed (or implemented) into the respective openings of the first and second encapsulation layers 240a-b (i.e., the openings 234-235 of FIG. 2F), where these first and second vias 280b and 281b are also filled with the resin 275. For some embodiments, the first and second vias 280b and 281b may be implemented with a standard plug process (or a pick and place process) and/or the like. Note that the first and second vias 280b and 281b may be implemented (or manufactured) with the same or different processes that are implemented for the first and second vias 280a and 281a.

Figure 2H:
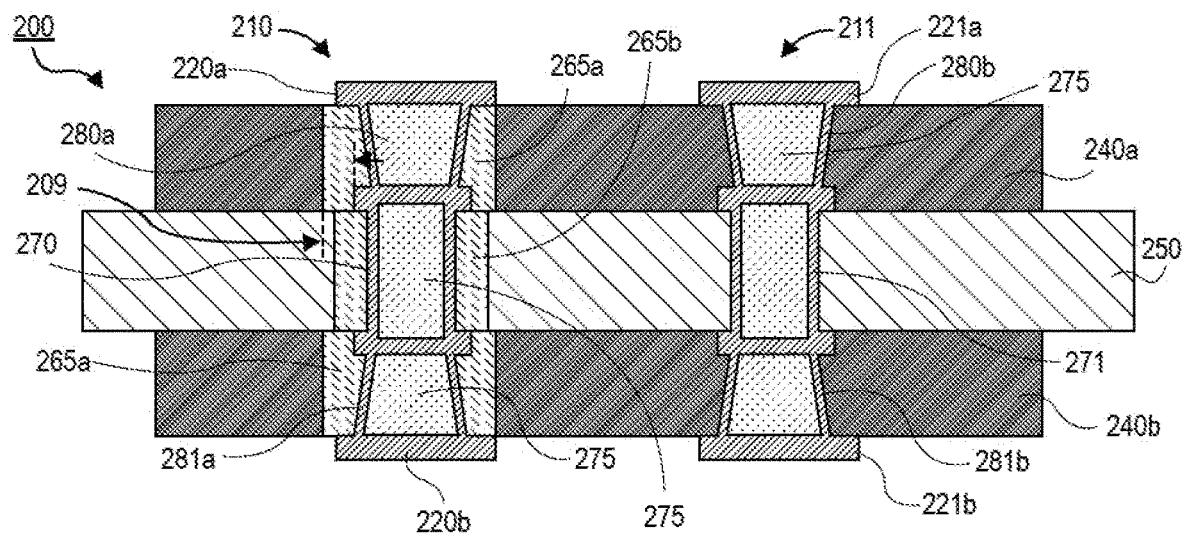

Referring now to FIG. 2H, a cross-sectional illustration of a package substrate 200 is shown, in accordance with an embodiment. For one embodiment, portions of the conductive material, which was implemented for the first and second vias 280a and 281a, may be removed (or etched) to expose the top surfaces of the first and second encapsulation layers 240a-b, the first magnetic portions 265a, and/or the resin 275 of the first and second vias 280a and 281a. In an embodiment, a plurality of first and second conductive pads 220a-b and 221a-b may be disposed over the respective first and second vias 280a-b and 281a-b to implement (or finalize) a first PTH via 210 and a second PTH via 211.

As shown in FIG. 2H and described above, the first and second PTH vias 210-211 may respectively include the first and second cores 270-271, the first vias 280a-b, and the second vias 281a-b. The first and second PTH vias 210-211 may be substantially similar to the first and second PTH vias 110-111 described above in FIG. 1A. Accordingly, as described above, the package substrate 200 includes the first and second PTH vias 210-211 that are implemented sandwich-molded magnetic coaxial core structures (or sandwich-molded MILs) with substantially vertical sidewalls of the first magnetic portions 265a, and with substantially higher thicknesses for increased/heightened inductances, where such higher thicknesses are the result of the combined thicknesses of the first and second cores 270-271, the first and second vias 280a-b and 281a-b, and the first and second conductive pads 220a-b and 221a-b (i.e., the combined thicknesses of the first and second encapsulation layers 240a-b and the core substrate 250).

Note that the package substrate 200 of FIGS. 2A-2H may include fewer or additional packaging components based on the desired packaging design.

FIGS. 3A-3H are illustrations of cross-sectional views of a process flow to form a package substrate 300 with a first PTH via 312 and a second PTH via 311, according to some embodiments. The process flow illustrated in FIGS. 3A-3H forms the package substrate 300 that is substantially similar to the package substrate 101 described above in FIG. 1B. Likewise, the components of the package substrate 300 are substantially similar to the components of the package substrate 101 described above in FIG. 1B. Accordingly, as described above, the process flow of the package substrate 300 illustrates one of the approaches to implement sandwich-molded magnetic coaxial core structures (or sandwich-molded MILs) with substantially higher thicknesses for increased/heightened inductances. In some embodiments, as described below, the process of the package substrate 300 may be implemented with a standard encapsulation process (or the like), a lithographic process, and/or any combination thereof to form such magnetic coaxial core structures, which may also implement first magnetic portions 366a with tapered sidewalls.

Figure 3A:
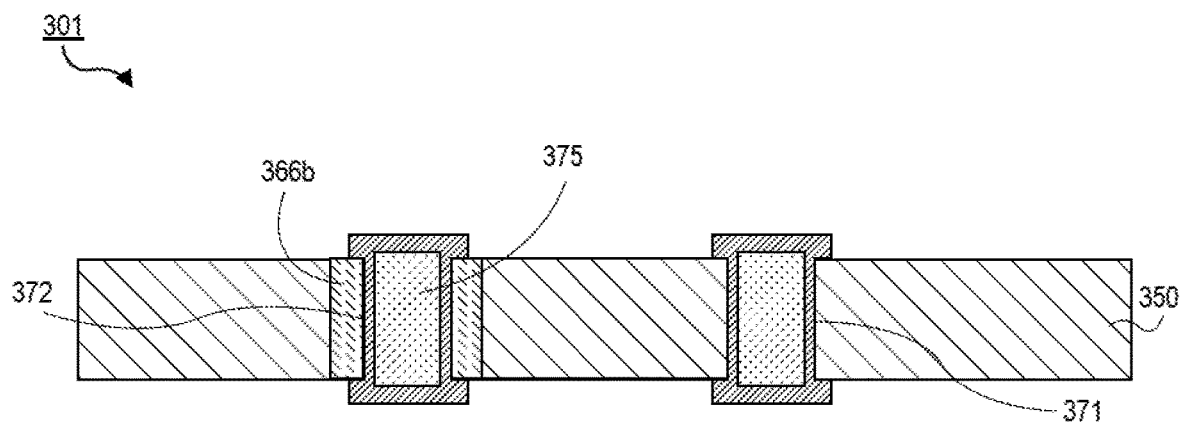
FIGS. 3A-3H are illustrations of cross-sectional views of a process flow to form a package substrate with a plurality of PTH vias, a core substrate, and a plurality of encapsulation layers, where the PTH vias are embedded in the core substrate and the encapsulation layers, according to some embodiments.

Referring now to FIG. 3A, a cross-sectional illustration of a package substrate 300 is shown, in accordance with an embodiment. In an embodiment, the package substrate 300 may include a core substrate 350. The core substrate 350 may include a first core 372 and a second core 371, where the first and second cores 372-371 may be filled with a resin 375. In one embodiment, the first core 372 may be surrounded with a second magnetic portion 366b, where the second magnetic portion 366b may isolate the first core 372. For one embodiment, the second magnetic portion 366b may have a width (or a total width) that is greater than a width of the first core 372.

Figure 3B:
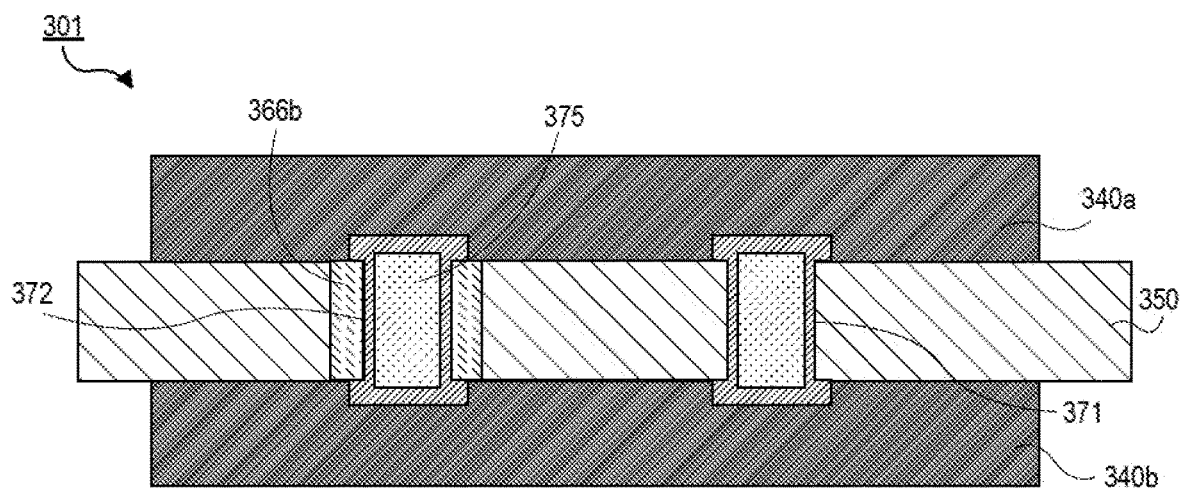

Referring now to FIG. 3B, a cross-sectional illustration of a package substrate 300 is shown, in accordance with an embodiment. In an embodiment, a plurality of first and second encapsulation layers 340a-b are disposed over the second magnetic portion 366b and the first and second cores 372-371 of the core substrate 350. In one embodiment, the first and second encapsulation layers 340a-b may be implemented (overmolded) with a molding process (or a two-sided mold application process) or the like. Additionally, in another embodiment, the first and second encapsulation layers 340a-b may be planarized with a polishing/grinding process or the like. The first and second encapsulation layers 340a-b may be substantially similar to the first and second encapsulation layers 140a-b described above in FIG. 1B (i.e., the first and second encapsulation layers 340a-b may be mold layers).

Figure 3C:
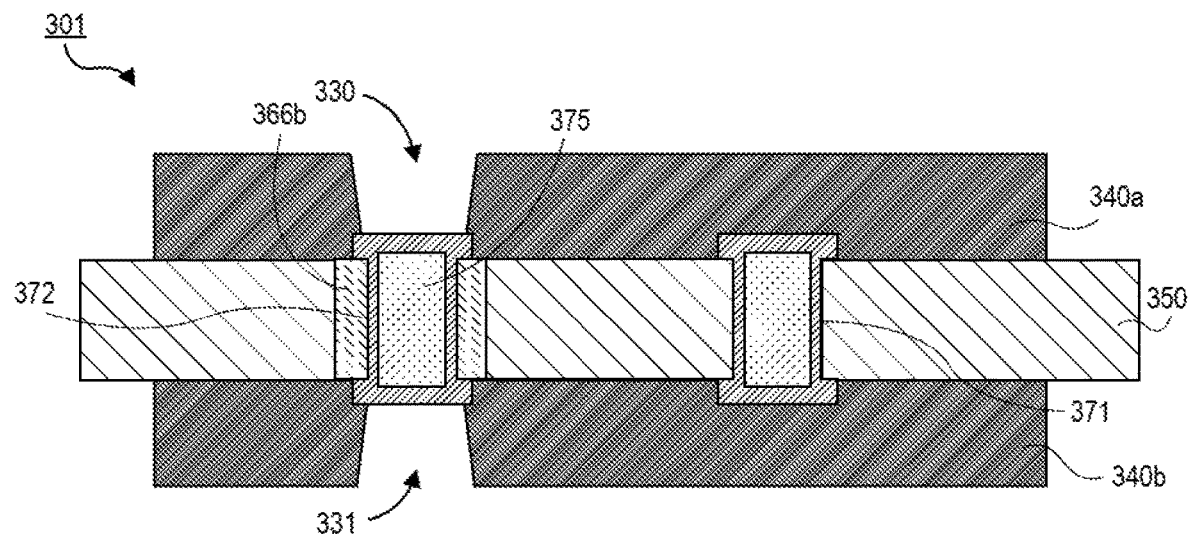

Referring now to FIG. 3C, a cross-sectional illustration of a package substrate 300 is shown, in accordance with an embodiment. In an embodiment, openings 330-331 may be symmetrically patterned (or developed/removed) into the respective encapsulation layers 340a-b using a LTH drill process or the like. In one embodiment, the opening 330 may be patterned over the first core 372, while the opening 331 may be respectively patterned below the first core 372. Furthermore, as described above, the openings 330-331 of the first and second encapsulation layers 340a-b may have tapered sidewalls.

Figure 3D:
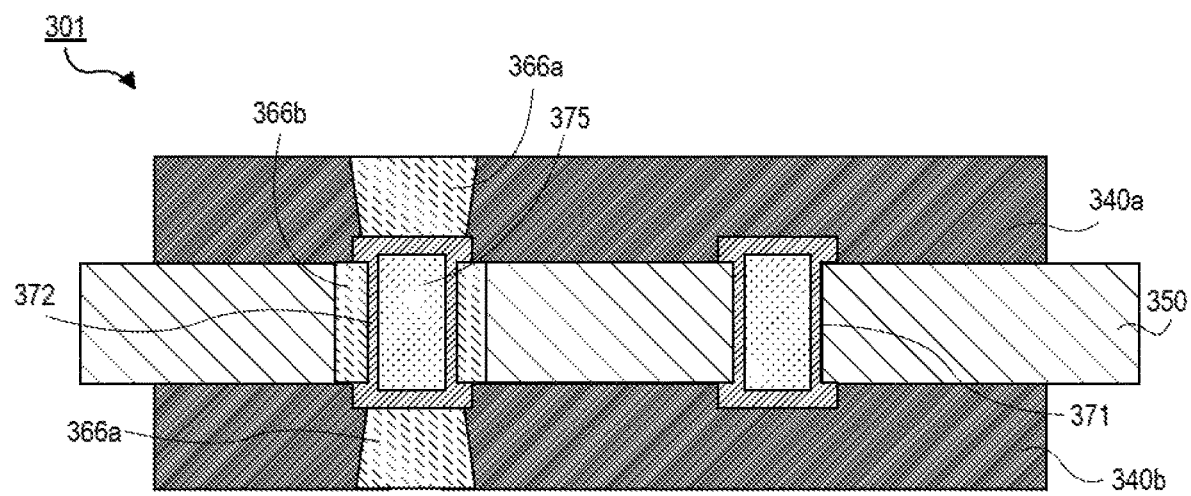

Referring now to FIG. 3D, a cross-sectional illustration of a package substrate 300 is shown, in accordance with an embodiment. In an embodiment, first magnetic portions 366a may be symmetrically disposed (or plugged) into the respective openings 330-331. Furthermore, as described above, the first magnetic portions 366a may have tapered sidewalls. The first magnetic portions 366a may be implemented with any known packaging processes. The first magnetic portions 366a may be substantially similar to the second magnetic portion 366b. In one embodiments, the first magnetic portions 366a may be planarized to have top surfaces that are substantially coplanar to the top surfaces of the respective encapsulation layers 340a-b.

Figure 3E:
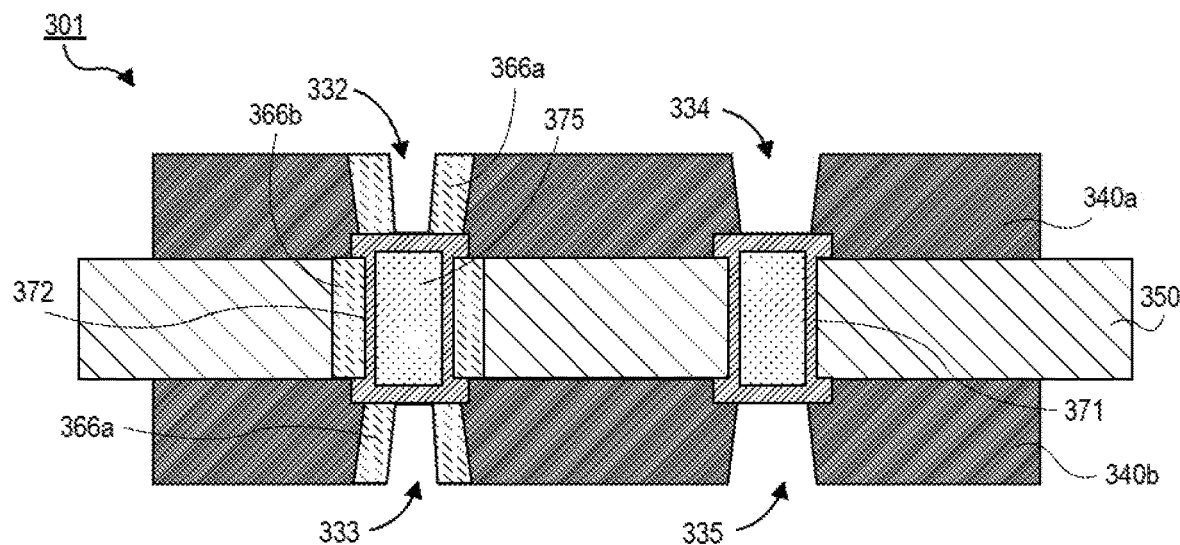

Referring now to FIG. 3E, a cross-sectional illustration of a package substrate 300 is shown, in accordance with an embodiment. In an embodiment, openings 332-335 may be patterned (or drilled) into the respective first magnetic portions 366a and the first and second encapsulation layers 340a-b using a LTH drilling process (or the like) with a high-pressure water clean and so on. In one embodiment, the opening 332 may be patterned into the top first magnetic portion 366a to expose a surface of the top conductive pad of the first core 372. In an embodiment, the opening 333 may be patterned into the first magnetic portion 366a to expose a surface of the bottom conductive pad of the first core 372. In one embodiment, the opening 334 may be patterned into the first encapsulation layer 340a to expose a surface of the top conductive pad of the second core 371. In an embodiment, the opening 335 may be patterned into the second encapsulation layer 340b to expose a surface of the bottom conductive pad of the second core 371.

Figure 3F:
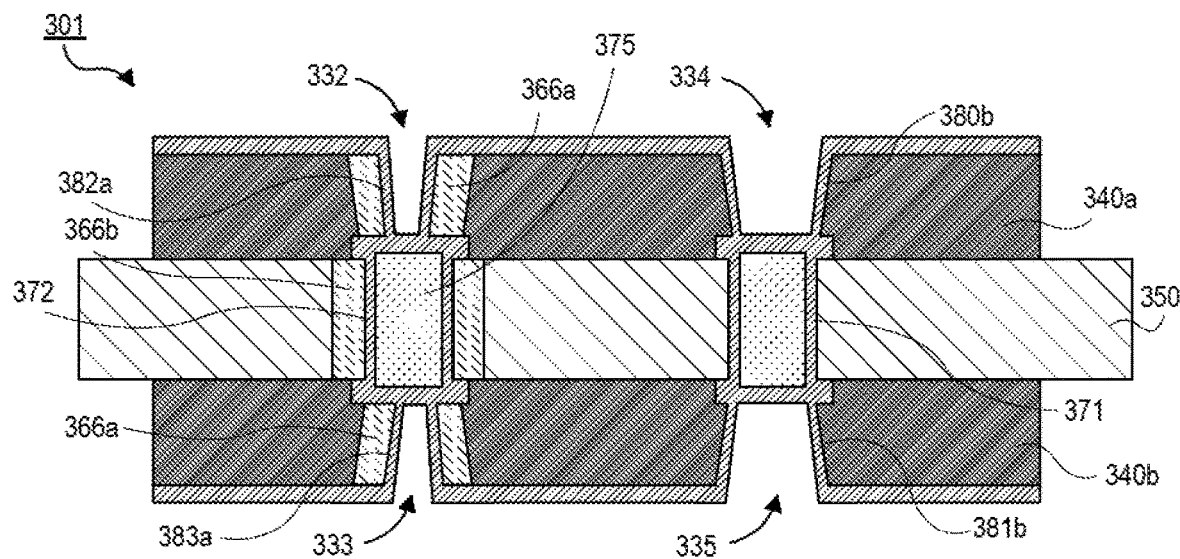

Referring now to FIG. 3F, a cross-sectional illustration of a package substrate 300 is shown, in accordance with an embodiment. In an embodiment, a conductive material (e.g., copper or the like) may be disposed over the first and second encapsulation layers 340a-b and into the openings 332-335 to implement a first vias 380b and 382a and a second vias 381b and 383a, where the first and second vias 382a and 383a are disposed into/onto the exposed walls of the respective first magnetic portions 366a, and where the first and second vias 380b and 381b are disposed into/onto the exposed walls of the respective first and second encapsulation layers 340a-b. Moreover, as shown in FIG. 3F and described above, the first and second vias 382a and 383a have a width that is less than a width of the first and second vias 380b and 381b.

Figure 3G:
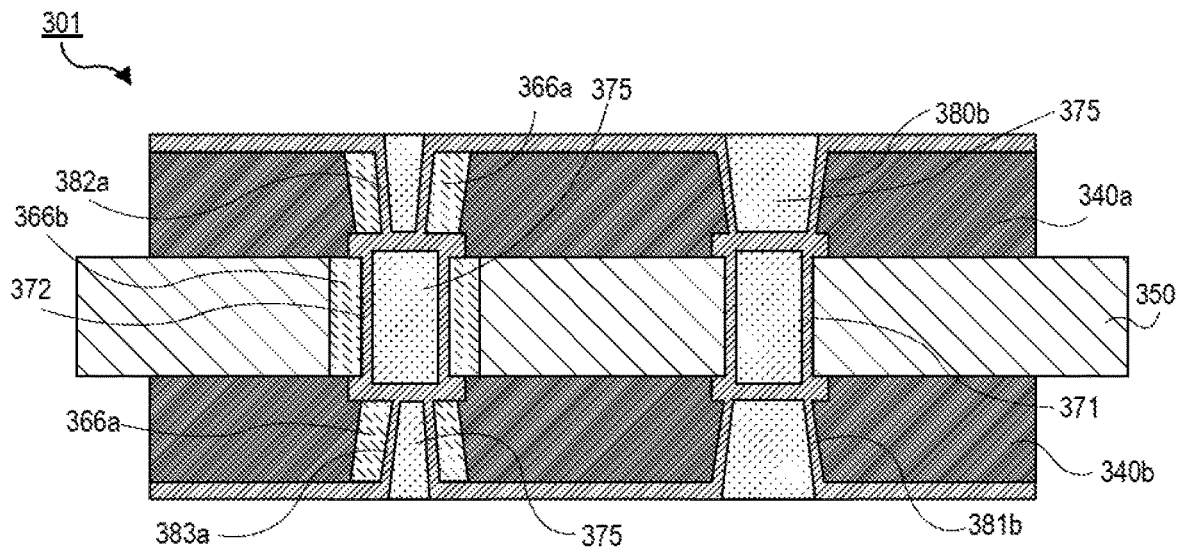

Referring now to FIG. 3G, a cross-sectional illustration of a package substrate 300 is shown, in accordance with an embodiment. In an embodiment, the resin 375 may be disposed over the first vias 380b and 382a and the second vias 381b and 383a. For some embodiments, the first vias 380b and 382a and the second vias 381b and 383a may be filled with the resin 375 by implementing a standard plug process and/or the like.

Figure 3H:
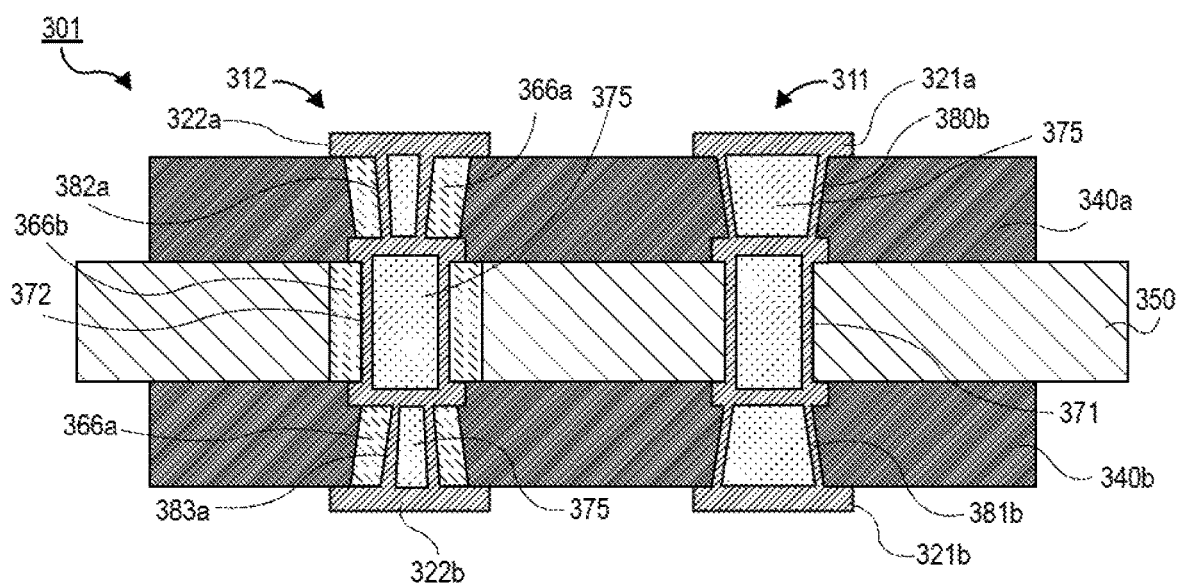

Referring now to FIG. 3H, a cross-sectional illustration of a package substrate 300 is shown, in accordance with an embodiment. For one embodiment, portions of the conductive material, which was implemented for the first vias 380b and 382a and the second vias 381b and 383a, may be removed (or etched) to expose the top surfaces of the first and second encapsulation layers 340a-b, the first magnetic portions 366a, and/or the resin 375 of the first vias 380b and 382a and the second vias 381b and 383a. In an embodiment, a plurality of first and second conductive pads 321a-b and 322a-b may be disposed over the respective first and second vias the first vias 380b and 382a and the second vias 381b and 383a to implement (or finalize) the first PTH via 312 and the second PTH via 311.

As shown in FIG. 3H and described above, the first and second PTH vias 312-311 may respectively include the first and second cores 372-371, the first vias 380b and 382a, and the second vias 381b and 383a. The first and second PTH vias 312-311 may be substantially similar to the first and second PTH vias 112-111 described above in FIG. 1B. Accordingly, as described above, the package substrate 300 includes the first and second PTH vias 312-311 that are implemented sandwich-molded magnetic coaxial core structures (or sandwich-molded MILs) with tapered sidewalls of the first magnetic portions 366a, and with substantially higher thicknesses for increased/heightened inductances, where such higher thicknesses are the result of the combined thicknesses of the first and second cores 372-371, the first vias 380b and 382a and the second vias 381b and 383a, and the first and second conductive pads 321a-b and 322a-b (i.e., the combined thicknesses of the first and second encapsulation layers 340a-b and the core substrate 350).

Note that the package substrate 300 of FIGS. 3A-3H may include fewer or additional packaging components based on the desired packaging design.

Figure 4:
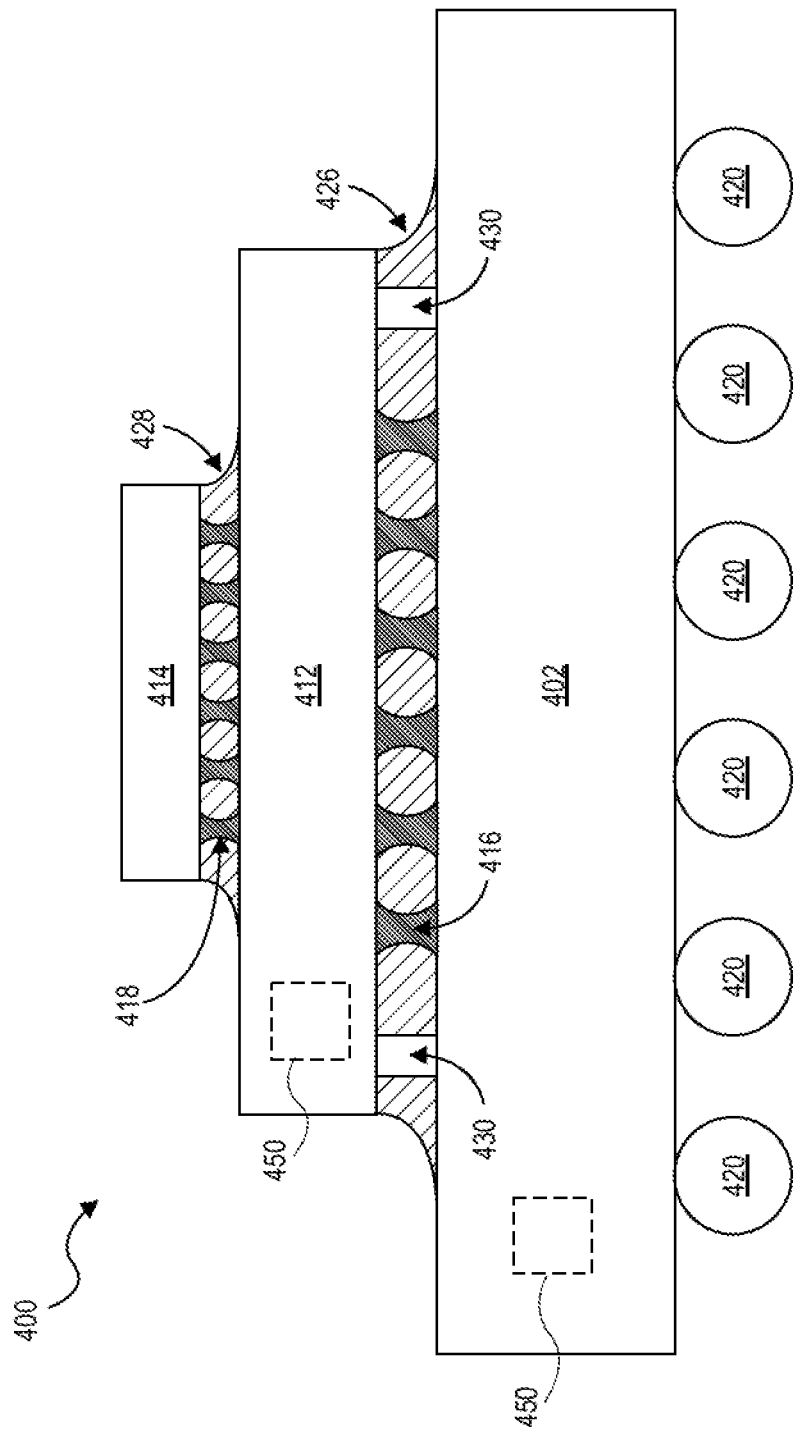
FIG. 4 is an illustration of a cross-sectional view of a semiconductor package with a die, a package substrate, and a substrate, where such substrate(s) include a plurality of PTH vias, a core substrate, and a plurality of encapsulation layers, and where the PTH vias are embedded in the core substrate and the encapsulation layers, according to one embodiment.

FIG. 4 is an illustration of a cross-sectional view of a semiconductor packaged system 400 including a die 414, a substrate 412, a package substrate 402, and a plurality of PTH vias 450, according to one embodiment. FIG. 4 illustrates a semiconductor package 400 including a die 414, a substrate 412 (or an interposer), interconnect structures (e.g., the plurality of bumps disposed below the die 414 and the substrate 412), and the package substrate 402, where the substrate 412 and/or the package substrate 402 may include the PTH vias 450, the core substrates, and the encapsulation layers, and where the PTH vias 450 are embedded in the core substrates and the encapsulation layers of the respective substrates 402 and/or 412, according to some embodiments.

For one embodiment, the semiconductor package 400 may implement the substrate 412 and/or the package substrate 402 to include the PTH vias 450 (as the coupled magnetic and non-magnetic PTH vias with substantially increased thicknesses, substantially vertical sidewalls, and/or tapered sidewalls as described herein). In some embodiment, the PTH vias 450 of the substrate 412 and/or the package substrate 402 may be substantially similar to the PTH vias 110-112 of the package substrates 100-101 described above in FIGS. 1A-1B. Note that the semiconductor package 400 is not limited to the illustrated semiconductor packaged system, and thus may be designed/formed with fewer, alternate, or additional packaging components and/or with different interconnecting structures.

According to one embodiment, the semiconductor package 400 is merely one example of an embodiment of a semiconductor packaged system. For one embodiment, the semiconductor package 400 may include a ball grid array (BGA) package, a land grid array (LGA) package, and/or a pin grid array (PGA) package. For one embodiment, a die 414 is coupled to a substrate 412 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 414, the substrate 412, and the package substrate 402 may be coupled using anisotropic conductive film (ACF). For one embodiment, the substrate 412 may be, but is not limited to, a silicon interposer and/or a die with through silicon vias (TSVs). For an alternate embodiment, the semiconductor package 400 may omit the interposer/substrate 412.

For some embodiments, the semiconductor package 400 may have the die 414 disposed on the interposer 412, where both the stacked die 414 and interposer 412 are disposed on a package substrate 402. According to some embodiments, the package substrate 402 may include, but is not limited to, a package, a substrate, a PCB, and a motherboard. For one embodiment, the package substrate 402 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 402 may also include conductive layers that comprise copper lines/traces, metallic pads, vias, via pads, planes, and/or holes.

For one embodiment, the die 414 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The die 414 may be formed from a material such as silicon and have circuitry thereon that is to be coupled to the interposer 412. Although some embodiments are not limited in this regard, the package substrate 402 may in turn be coupled to another body, for example, a computer motherboard. One or more connections between the package substrate 402, the interposer 412, and the die 414—e.g., including some or all of bumps 416, 418, and 420—may include one or more interconnect structures and underfill layers 426 and 428. In some embodiments, these interconnect structures (or connections) may variously comprise an alloy of nickel, palladium, and tin (and, in some embodiments, copper).

Connections between the package substrate 402 and another body may be made using any suitable structure, such as the illustrative bumps 420 shown. The package substrate 402 may include a variety of electronic structures formed thereon or therein. The interposer 412 may also include electronic structures formed thereon or therein, which may be used to couple the die 414 to the package substrate 402. For one embodiment, one or more different materials may be used for forming the package substrate 402 and the interposer 412. In certain embodiments, the package substrate 402 is an organic substrate made up of one or more layers of polymer base material, with conducting regions for transmitting signals. In certain embodiments, the interposer 412 is made up of a ceramic base material including metal regions for transmitting signals. Although some embodiments are not limited in this regard, the semiconductor package 400 may include gap control structures 430—e.g., positioned between the package substrate 402 and the interposer 412. Such gap control structures 430 may mitigate a change in the height of the gap between the package substrate 402 and the interposer 412, which otherwise might occur during reflowing while die 414 is attached to interposer 412. Note that the semiconductor package 400 includes an underfill material 428 between the interposer 412 and the die 414, and an underflow material 426 between the package substrate 402 and the interposer 412. For one embodiment, the underfill materials (or layers) 426 and 428 may be one or more polymers that are injected between the layers. For other embodiments, the underfill materials may be molded underfills (MUF).

Note that the semiconductor package 400 may include fewer or additional packaging components based on the desired packaging design.

Figure 5:
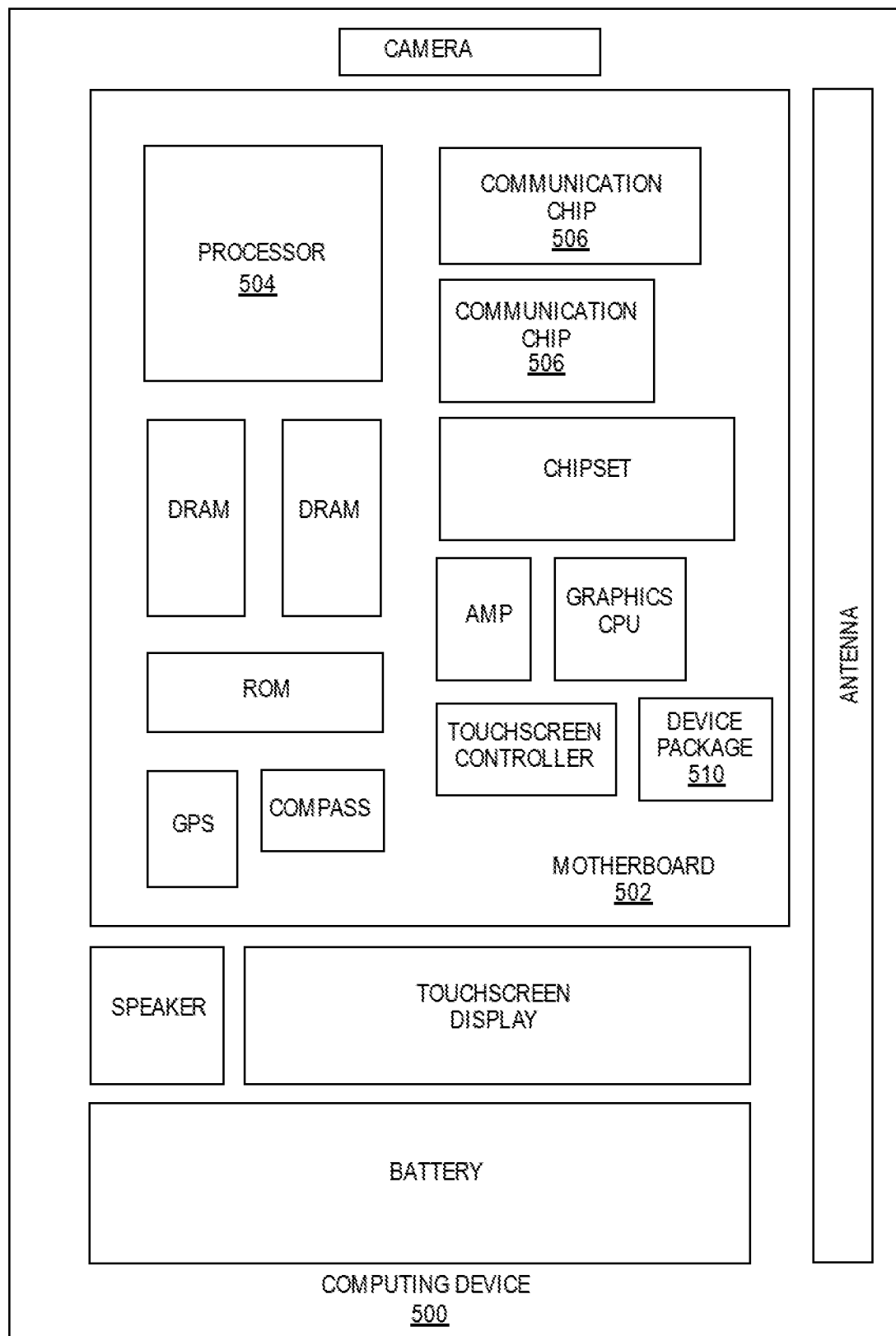
FIG. 5 is an illustration of a schematic block diagram illustrating a computer system that utilizes a device package with a package substrate with a plurality of PTH vias, a core substrate, and a plurality of encapsulation layers, where the PTH vias are embedded in the core substrate and the encapsulation layers, according to one embodiment.

FIG. 5 is an illustration of a schematic block diagram illustrating a computer system 500 that utilizes a device package 510 (or a semiconductor package) with a package substrate with a plurality of PTH vias, a core substrate, and a plurality of encapsulation layers, where the PTH vias are embedded in the core substrate and the encapsulation layers, according to one embodiment. FIG. 5 illustrates an example of computing device 500. Computing device 500 houses a motherboard 502. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a package substrate, and/or a PCB. In one embodiment, device package 510 may include a package substrate that may be substantially similar to the package substrates 100-101, 200, and 300 of FIGS. 1A-1B and 2-3 described herein. Device package 510 may include the PTH vias, the core substrates, and the encapsulation layers, where the PTH vias are embedded (or sandwiched) in the core substrates and the encapsulation layers, and where such PTH vias may be coupled magnetic and non-magnetic PTH vias with substantially increased thicknesses, substantially vertical sidewalls, and/or tapered sidewalls as described herein (e.g., as illustrated and described above with the PTH vias in FIGS. 1-4)—or any other components from the figures described herein.

Note that device package 510 may be a single component/device, a subset of components, and/or an entire system, as the materials, features, and components may be limited to device package 510 and/or any other component of the computing device 500 that may need the PTH vias as described herein (e.g., the motherboard 502, the processor 504, and/or any other component of the computing device 500 that may need the embodiments of the PTH vias of the package substrates as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip 506 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising: a first encapsulation layer over a substrate; a second encapsulation layer below the substrate; a first interconnect and a second interconnect vertically in the first encapsulation layer, the second encapsulation layer, and the substrate, wherein the first interconnect includes a first plated-through-hole (PTH) core, a first via, and a second via, and wherein the second interconnect includes a second PTH core, a third via, and a fourth via; and a magnetic portion vertically surrounds the first interconnect, wherein the first PTH core has a top surface directly coupled to the first via, and a bottom surface directly coupled to the second via, and wherein the second PTH core has a top surface directly coupled to the third via, and a bottom surface directly coupled to the fourth via.

In example 2, the subject matter of example 1 can optionally include that each of the first and second encapsulation layers is a photoimageable mold layer, and wherein the first and second interconnects vertically extend from a bottom surface of the second encapsulation layer to a top surface of the first encapsulation layer.

In example 3, the subject matter of examples 1-2 can optionally include that a plurality of first conductive pads on the first interconnect, wherein one of the first conductive pads is directly on the first via, and another of the second conductive pads is directly on the second via; a plurality of second conductive pads on the second interconnect, wherein one of the second conductive pads is directly on the third via, and another of the second conductive pads is directly on the fourth via; and a resin material embedded in each of the first PTH core, the first via, and the second via of the first interconnect, and in each of the second PTH core, the third via, and the fourth via of the second interconnect.

In example 4, the subject matter of examples 1-3 can optionally include that the first and second PTH cores are in the substrate, wherein the first and third vias are in the first encapsulation layer, wherein the second and fourth vias are in the second encapsulation layer, wherein the first magnetic portion has a top surface that is substantially coplanar to the top surface of the first encapsulation layer, and wherein the first magnetic portion has a bottom surface that is substantially coplanar to the bottom surface of the second encapsulation layer.

In example 5, the subject matter of examples 1-4 can optionally include that the magnetic portion include a first magnetic portion and a second magnetic portion, wherein the second magnetic portion is in the substrate and surrounds the first PTH core, and wherein the first magnetic portion is in the first and second encapsulation layers and respectively surrounds the first via and the second via.

In example 6, the subject matter of examples 1-5 can optionally include that the first magnetic portion has a first width that is greater than a second width of the second magnetic portion.

In example 7, the subject matter of examples 1-6 can optionally include that the first magnetic portion is on the substrate and the second magnetic portion, and wherein the first magnetic portion has substantially vertical sidewalls.

In example 8, the subject matter of examples 1-7 can optionally include that an offset defined by the difference of the first width of the first magnetic portion and the second width of the second magnetic portion.

In example 9, the subject matter of examples 1-8 can optionally include that the first encapsulation layer surrounds the first magnetic portion that surrounds the first via, and wherein the second encapsulation layer surrounds the first magnetic portion that surrounds the second via.

Example 10 is a package substrate, comprising: a first encapsulation layer over a substrate; a second encapsulation layer below the substrate; a first interconnect and a second interconnect vertically in the first encapsulation layer, the second encapsulation layer, and the substrate, wherein the first interconnect includes a first PTH core, a first via, and a second via, and wherein the second interconnect includes a second PTH core, a third via, and a fourth via; and a magnetic portion surrounds the first interconnect, wherein the magnetic portion include a first magnetic portion and a second magnetic portion, wherein the first magnetic portion has tapered sidewalls that surround the first and second vias of the first interconnect, wherein the first PTH core has a top surface directly coupled to the first via, and a bottom surface directly coupled to the second via, and wherein the second PTH core has a top surface directly coupled to the third via, and a bottom surface directly coupled to the fourth via.

In example 11, the subject matter of example 10 can optionally include that each of the first and second encapsulation layers is a mold layer, and wherein the first and second interconnects vertically extend from a bottom surface of the second encapsulation layer to a top surface of the first encapsulation layer.

In example 12, the subject matter of examples 10-11 can optionally include a plurality of first conductive pads on the first interconnect, wherein one of the first conductive pads is directly on the first via, and another of the second conductive pads is directly on the second via; a plurality of second conductive pads on the second interconnect, wherein one of the second conductive pads is directly on the third via, and another of the second conductive pads is directly on the fourth via; and a resin material embedded in each of the first PTH core, the first via, and the second via of the first interconnect, and in each of the second PTH core, the third via, and the fourth via of the second interconnect.

In example 13, the subject matter of examples 10-12 can optionally include that the first and second PTH cores are in the substrate, wherein the first and third vias are in the first encapsulation layer, wherein the second and fourth vias are in the second encapsulation layer, wherein the first magnetic portion has a top surface that is substantially coplanar to the top surface of the first encapsulation layer, and wherein the first magnetic portion has a bottom surface that is substantially coplanar to the bottom surface of the second encapsulation layer.

In example 14, the subject matter of examples 10-13 can optionally include that the second magnetic portion is in the substrate and surrounds the first PTH core, and wherein the first magnetic portion is in the first and second encapsulation layers and respectively surrounds the first via and the second via.

In example 15, the subject matter of examples 10-14 can optionally include that the first magnetic portion has a first width that is less than a second width of the second magnetic portion.

In example 16, the subject matter of examples 10-15 can optionally include that the tapered sidewalls of the first magnetic portion are on the top and bottom surfaces of the first PTH core.

In example 17, the subject matter of examples 10-16 can optionally include an offset defined by the difference of the first width of the first magnetic portion and the second width of the second magnetic portion.

In example 18, the subject matter of examples 10-17 can optionally include that the first encapsulation layer surrounds the first magnetic portion that surrounds the first via, and wherein the second encapsulation layer surrounds the first magnetic portion that surrounds the second via.

Example 19 is a method to form a package substrate, comprising: disposing a first encapsulation layer over a substrate, wherein a first PTH core, a second PTH core, and a second magnetic portion are in the substrate, and wherein the second magnetic portion surrounds the first PTH core; disposing a second encapsulation layer below the substrate; patterning the first and second encapsulation layers to form first openings over and below the second magnetic portion and the first PTH core; disposing a magnetic material into the first openings to form a first magnetic portion over and below the second magnetic portion and the first PTH core, wherein the first magnetic portion is surrounded with the first and second encapsulation layers; patterning the first magnetic portion to form second openings over and below the first PTH core, and patterning the first and second encapsulation layers to form third openings over and below the second PTH core, wherein the second openings expose a top surface and a bottom surface of the first PTH core, and wherein the third openings expose a top surface and a bottom surface of the second PTH core; disposing a conductive material into the second openings to form a first via and a second via, and the conductive material into the third openings to form a third via and a fourth via, wherein the first via is directly coupled to the top surface of the first PTH core, wherein the second via is directly coupled to the bottom surface of the first PTH core, wherein the third via is directly coupled to the top surface of the second PTH core, and wherein the fourth via directly coupled to the bottom surface of the second PTH core; and disposing a plurality of first conductive pads on the first and second vias to form a first interconnect, and a plurality of second conductive pads on the third and fourth vias to form a second interconnect, wherein the first interconnect and second interconnects are vertically disposed through the first encapsulation layer, the second encapsulation layer, and the substrate, wherein the first interconnect includes the first PTH core, the first via, and the second via, and wherein the second interconnect includes the second PTH core, the third via, and a fourth via, and wherein the first and second magnetic portions vertically surround the first interconnect.

In example 20, the subject matter of example 19 can optionally include that each of the first and second encapsulation layers is a photoimageable mold layer or a mold layer, and wherein the first and second interconnects vertically extend from a bottom surface of the second encapsulation layer to a top surface of the first encapsulation layer, wherein one of the first conductive pads is directly on the first via, and another of the second conductive pads is directly on the second via, wherein one of the second conductive pads is directly on the third via, and another of the second conductive pads is directly on the fourth via.

In example 21, the subject matter of examples 19-20 can optionally include a resin material embedded in each of the first PTH core, the first via, and the second via of the first interconnect, wherein the resin material is embedded in each of the second PTH core, the third via, and the fourth via of the second interconnect.

In example 22, the subject matter of examples 19-21 can optionally include the first and third vias are in the first encapsulation layer, wherein the second and fourth vias are in the second encapsulation layer, wherein the second magnetic portion is in the substrate and surrounds the first PTH core, and wherein the first magnetic portion is in the first and second encapsulation layers and respectively surrounds the first via and the second via.

In example 23, the subject matter of examples 19-22 can optionally include the first magnetic portion has a top surface that is substantially coplanar to the top surface of the first encapsulation layer, and wherein the first magnetic portion has a bottom surface that is substantially coplanar to the bottom surface of the second encapsulation layer.

In example 24, the subject matter of examples 19-23 can optionally include the first magnetic portion has tapered sidewalls or substantially vertical sidewalls.

In example 25, the subject matter of examples 19-24 can optionally include an offset defined by a difference of a first width of the first magnetic portion and a second width of the second magnetic portion, wherein the first encapsulation layer surrounds the first magnetic portion that surrounds the first via, and wherein the second encapsulation layer surrounds the first magnetic portion that surrounds the second via.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
   a first encapsulation layer over a substrate;
   a second encapsulation layer below the substrate;
   a first interconnect and a second interconnect vertically in the first encapsulation layer, the second encapsulation layer, and the substrate, wherein the first interconnect includes a first plated-through-hole (PTH) core, a first via, and a second via, and wherein the second interconnect includes a second PTH core, a third via, and a fourth via; and
   a magnetic portion vertically surrounding the first PTH core, the first via and the second via of the first interconnect, wherein the first PTH core has a top surface directly coupled to the first via, and a bottom surface directly coupled to the second via, and wherein the second PTH core has a top surface directly coupled to the third via, and a bottom surface directly coupled to the fourth via.

2. The package substrate of claim 1, wherein each of the first and second encapsulation layers is a photoimageable mold layer, and wherein the first and second interconnects vertically extend from a bottom surface of the second encapsulation layer to a top surface of the first encapsulation layer.

3. The package substrate of claim 1, further comprising:
   a plurality of first conductive pads on the first interconnect, wherein one of the first conductive pads is directly on the first via, and another of the second conductive pads is directly on the second via;
   a plurality of second conductive pads on the second interconnect, wherein one of the second conductive pads is directly on the third via, and another of the second conductive pads is directly on the fourth via; and
   a resin material embedded in each of the first PTH core, the first via, and the second via of the first interconnect, and in each of the second PTH core, the third via, and the fourth via of the second interconnect.

4. The package substrate of claim 1, wherein the first and second PTH cores are in the substrate, wherein the first and third vias are in the first encapsulation layer, wherein the second and fourth vias are in the second encapsulation layer, wherein the first magnetic portion has a top surface that is substantially coplanar to the top surface of the first encapsulation layer, and wherein the first magnetic portion has a bottom surface that is substantially coplanar to the bottom surface of the second encapsulation layer.

5. The package substrate of claim 1, wherein the magnetic portion include a first magnetic portion and a second magnetic portion, wherein the second magnetic portion is in the substrate and surrounds the first PTH core, and wherein the first magnetic portion is in the first and second encapsulation layers and respectively surrounds the first via and the second via.

6. The package substrate of claim 5, wherein the first magnetic portion has a first width that is greater than a second width of the second magnetic portion.

7. The package substrate of claim 6, further comprising an offset defined by the difference of the first width of the first magnetic portion and the second width of the second magnetic portion.

8. The package substrate of claim 5, wherein the first magnetic portion is on the substrate and the second magnetic portion, and wherein the first magnetic portion has substantially vertical sidewalls.

9. The package substrate of claim 5, wherein the first encapsulation layer surrounds the first magnetic portion that surrounds the first via, and wherein the second encapsulation layer surrounds the first magnetic portion that surrounds the second via.

10. A package substrate, comprising:
    a first encapsulation layer over a substrate;
    a second encapsulation layer below the substrate;
    a first interconnect and a second interconnect vertically in the first encapsulation layer, the second encapsulation layer, and the substrate, wherein the first interconnect includes a first PTH core, a first via, and a second via, and wherein the second interconnect includes a second PTH core, a third via, and a fourth via; and a magnetic portion surrounds the first interconnect, wherein the magnetic portion include a first magnetic portion and a second magnetic portion, wherein the first magnetic portion has tapered sidewalls that surround the first and second vias of the first interconnect, wherein the first PTH core has a top surface directly coupled to the first via, and a bottom surface directly coupled to the second via, and wherein the second PTH core has a top surface directly coupled to the third via, and a bottom surface directly coupled to the fourth via.

11. The package substrate of claim 10, wherein each of the first and second encapsulation layers is a mold layer, and wherein the first and second interconnects vertically extend from a bottom surface of the second encapsulation layer to a top surface of the first encapsulation layer.

12. The package substrate of claim 10, further comprising:
a plurality of first conductive pads on the first interconnect, wherein one of the first conductive pads is directly on the first via, and another of the second conductive pads is directly on the second via;
a plurality of second conductive pads on the second interconnect, wherein one of the second conductive pads is directly on the third via, and another of the second conductive pads is directly on the fourth via; and
a resin material embedded in each of the first PTH core, the first via, and the second via of the first interconnect, and in each of the second PTH core, the third via, and the fourth via of the second interconnect.

13. The package substrate of claim 10, wherein the first and second PTH cores are in the substrate, wherein the first and third vias are in the first encapsulation layer, wherein the second and fourth vias are in the second encapsulation layer, wherein the first magnetic portion has a top surface that is substantially coplanar to the top surface of the first encapsulation layer, and wherein the first magnetic portion has a bottom surface that is substantially coplanar to the bottom surface of the second encapsulation layer.

14. The package substrate of claim 10, wherein the second magnetic portion is in the substrate and surrounds the first PTH core, and wherein the first magnetic portion is in the first and second encapsulation layers and respectively surrounds the first via and the second via.

15. The package substrate of claim 10, wherein the first magnetic portion has a first width that is less than a second width of the second magnetic portion.

16. The package substrate of claim 15, further comprising an offset defined by the difference of the first width of the first magnetic portion and the second width of the second magnetic portion.

17. The package substrate of claim 10, wherein the tapered sidewalls of the first magnetic portion are on the top and bottom surfaces of the first PTH core.

18. The package substrate of claim 10, wherein the first encapsulation layer surrounds the first magnetic portion that surrounds the first via, and wherein the second encapsulation layer surrounds the first magnetic portion that surrounds the second via.

19. A method to form a package substrate, comprising:
disposing a first encapsulation layer over a substrate, wherein a first PTH core, a second PTH core, and a second magnetic portion are in the substrate, and wherein the second magnetic portion surrounds the first PTH core;
disposing a second encapsulation layer below the substrate;
patterning the first and second encapsulation layers to form first openings over and below the second magnetic portion and the first PTH core;
disposing a magnetic material into the first openings to form a first magnetic portion over and below the second magnetic portion and the first PTH core, wherein the first magnetic portion is surrounded with the first and second encapsulation layers;
patterning the first magnetic portion to form second openings over and below the first PTH core, and patterning the first and second encapsulation layers to form third openings over and below the second PTH core, wherein the second openings expose a top surface and a bottom surface of the first PTH core, and wherein the third openings expose a top surface and a bottom surface of the second PTH core;
disposing a conductive material into the second openings to form a first via and a second via, and the conductive material into the third openings to form a third via and a fourth via, wherein the first via is directly coupled to the top surface of the first PTH core, wherein the second via is directly coupled to the bottom surface of the first PTH core, wherein the third via is directly coupled to the top surface of the second PTH core, and wherein the fourth via directly coupled to the bottom surface of the second PTH core; and
disposing a plurality of first conductive pads on the first and second vias to form a first interconnect, and a plurality of second conductive pads on the third and fourth vias to form a second interconnect, wherein the first interconnect and second interconnects are vertically disposed through the first encapsulation layer, the second encapsulation layer, and the substrate, wherein the first interconnect includes the first PTH core, the first via, and the second via, and wherein the second interconnect includes the second PTH core, the third via, and a fourth via, and wherein the first and second magnetic portions vertically surround the first interconnect.

20. The method of claim 19, wherein each of the first and second encapsulation layers is a photoimageable mold layer or a mold layer, and wherein the first and second interconnects vertically extend from a bottom surface of the second encapsulation layer to a top surface of the first encapsulation layer, wherein one of the first conductive pads is directly on the first via, and another of the second conductive pads is directly on the second via, wherein one of the second conductive pads is directly on the third via, and another of the second conductive pads is directly on the fourth via.

21. The method of claim 19, further comprising a resin material embedded in each of the first PTH core, the first via, and the second via of the first interconnect, wherein the resin material is embedded in each of the second PTH core, the third via, and the fourth via of the second interconnect.

22. The method of claim 19, wherein the first and third vias are in the first encapsulation layer, wherein the second and fourth vias are in the second encapsulation layer, wherein the second magnetic portion is in the substrate and surrounds the first PTH core, and wherein the first magnetic portion is in the first and second encapsulation layers and respectively surrounds the first via and the second via.

23. The method of claim 19, wherein the first magnetic portion has a top surface that is substantially coplanar to the top surface of the first encapsulation layer, and wherein the first magnetic portion has a bottom surface that is substantially coplanar to the bottom surface of the second encapsulation layer.

24. The method of claim 19, wherein the first magnetic portion has tapered sidewalls or substantially vertical sidewalls.

25. The method of claim 19, further comprising an offset defined by a difference of a first width of the first magnetic portion and a second width of the second magnetic portion, wherein the first encapsulation layer surrounds the first magnetic portion that surrounds the first via, and wherein the second encapsulation layer surrounds the first magnetic portion that surrounds the second via.

\* \* \* \* \*